United States Patent
Brost

(10) Patent No.: US 6,745,823 B2
(45) Date of Patent: Jun. 8, 2004

(54) HEAT EXCHANGER FOR ELECTRONIC/ELECTRICAL COMPONENTS

(75) Inventor: Viktor Brost, Aichtal (DE)

(73) Assignee: Modine Manufacturing Company, Racine, WI (US)

( * ) Notice: Subject to any disclaimer, the term of this patent is extended or adjusted under 35 U.S.C. 154(b) by 0 days.

(21) Appl. No.: 10/372,732

(22) Filed: Feb. 21, 2003

(65) Prior Publication Data
US 2003/0178179 A1 Sep. 25, 2003

(30) Foreign Application Priority Data
Feb. 23, 2002 (DE) .......................... 102 07 873

(51) Int. Cl.⁷ .................................................. F28F 7/00
(52) U.S. Cl. ....................... 165/80.4; 165/41; 165/80.5; 123/41.31; 361/699; 361/719
(58) Field of Search .............................. 165/42, 41, 51, 165/80.4; 123/41.31; 361/699, 719

(56) References Cited

U.S. PATENT DOCUMENTS

| | | | | |
|---|---|---|---|---|
| 3,776,305 A | * | 12/1973 | Simmons | 165/104.25 |
| 3,874,183 A | | 4/1975 | Tabet | |
| 3,965,971 A | * | 6/1976 | Roggenkamp | 165/299 |
| 4,559,995 A | * | 12/1985 | Van der Stuyf | 165/47 |
| 4,893,390 A | * | 1/1990 | Hoeffken | 29/890.03 |
| 5,671,802 A | * | 9/1997 | Rogers | 165/41 |
| 5,685,361 A | * | 11/1997 | Demmler et al. | 165/41 |
| 6,216,677 B1 | * | 4/2001 | McConnell et al. | 123/568.24 |
| 6,396,692 B1 | * | 5/2002 | Farshi et al. | 361/690 |
| 6,662,859 B2 | * | 12/2003 | Strahle et al. | 165/104.13 |
| 6,666,263 B2 | * | 12/2003 | Luz et al. | 165/153 |

FOREIGN PATENT DOCUMENTS

| | | |
|---|---|---|
| DE | 19959023 | 6/2001 |
| DE | 10158387 | 6/2003 |
| EP | 1096647 | 5/2001 |
| GB | 2352092 | 1/2001 |

* cited by examiner

Primary Examiner—Terrell Mckinnon
(74) Attorney, Agent, or Firm—Wood, Phillips, Katz, Clark & Mortimer

(57) ABSTRACT

Both dynamic and static cooling capability for cooling electronic or electrical components on a circuit board is achieved in a heat exchanger that includes a circuit board on which the components to be cooled are mounted together with a coolant channel with a coolant inlet and a coolant outlet in heat exchange contact with the circuit board. The heat exchanger includes a container defining a coolant depot adjacent to and in heat exchange relation with the flow channel and adapted to contain a coolant to accept heat rejected by the components when coolant is not flowing in the coolant channel between the inlet and the outlet.

16 Claims, 8 Drawing Sheets

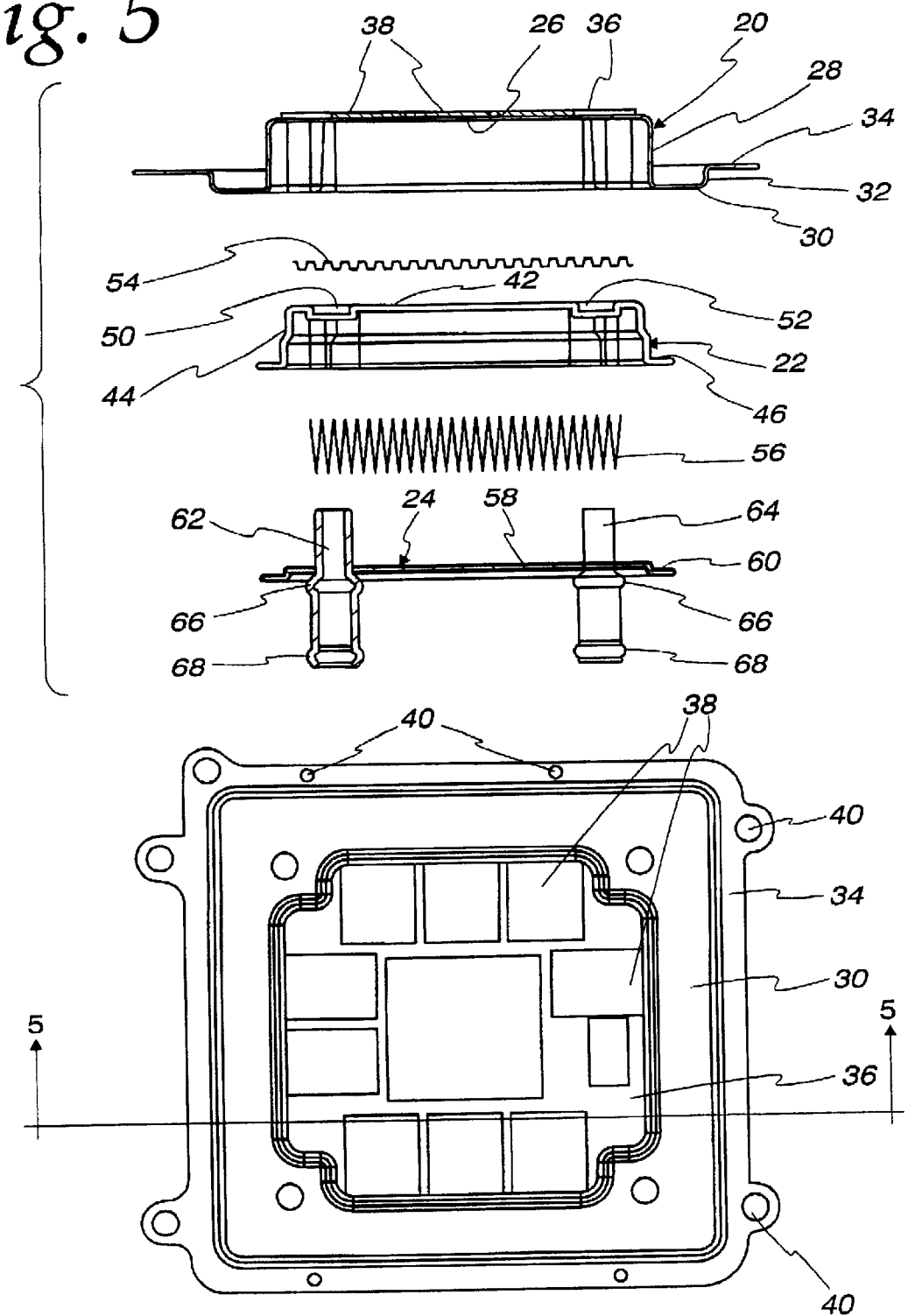

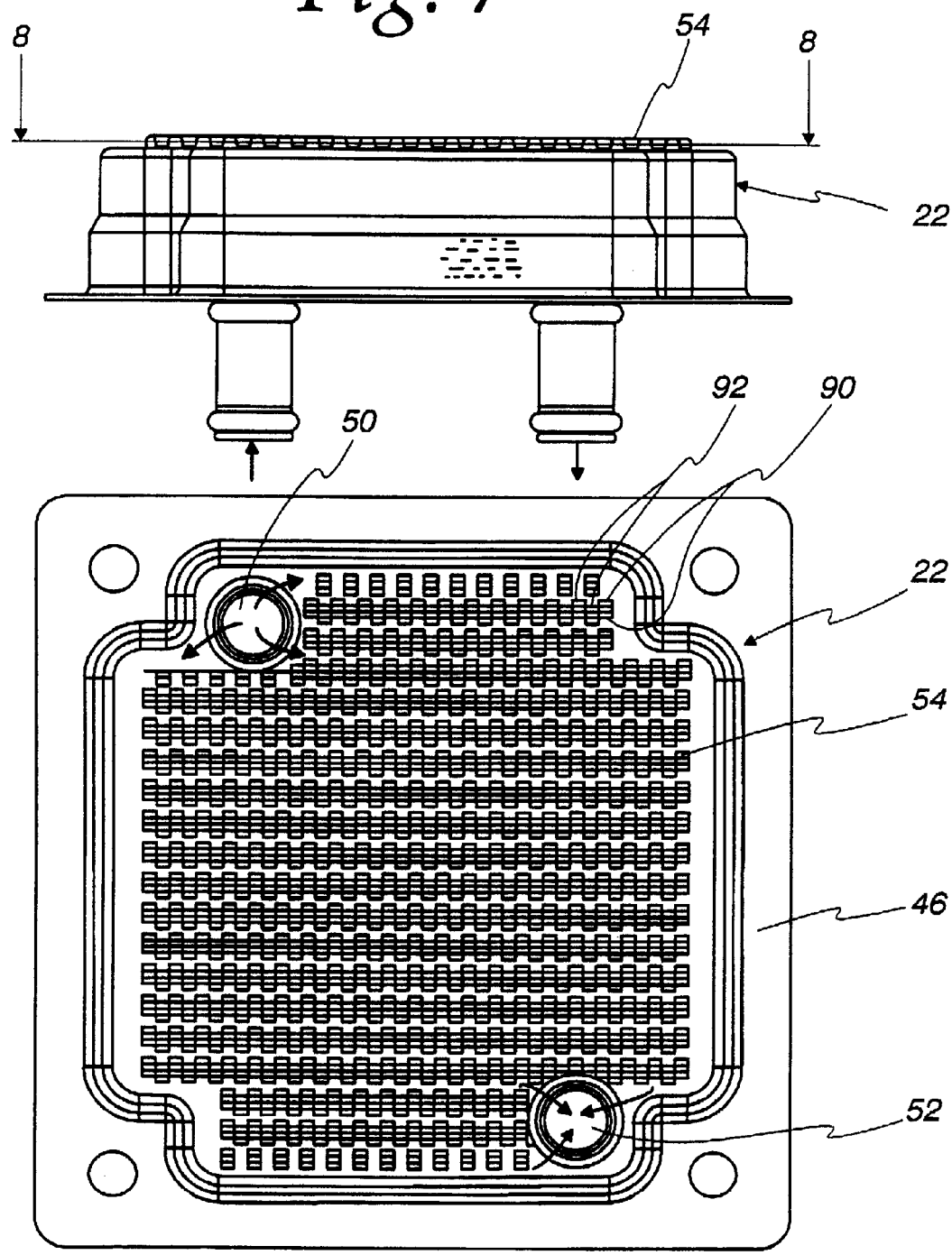

*Fig. 11*
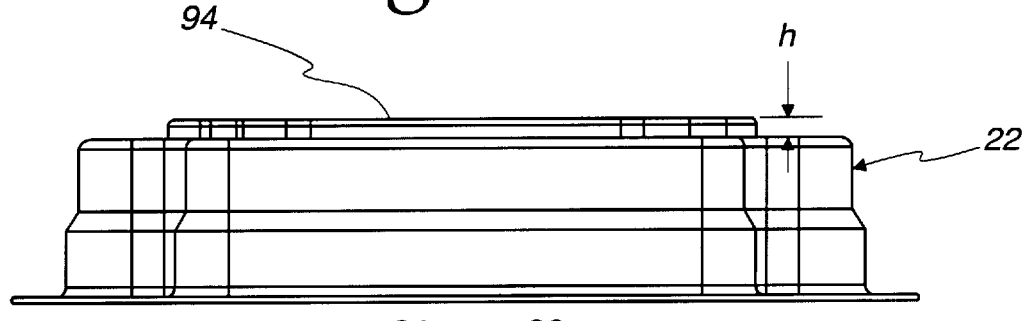
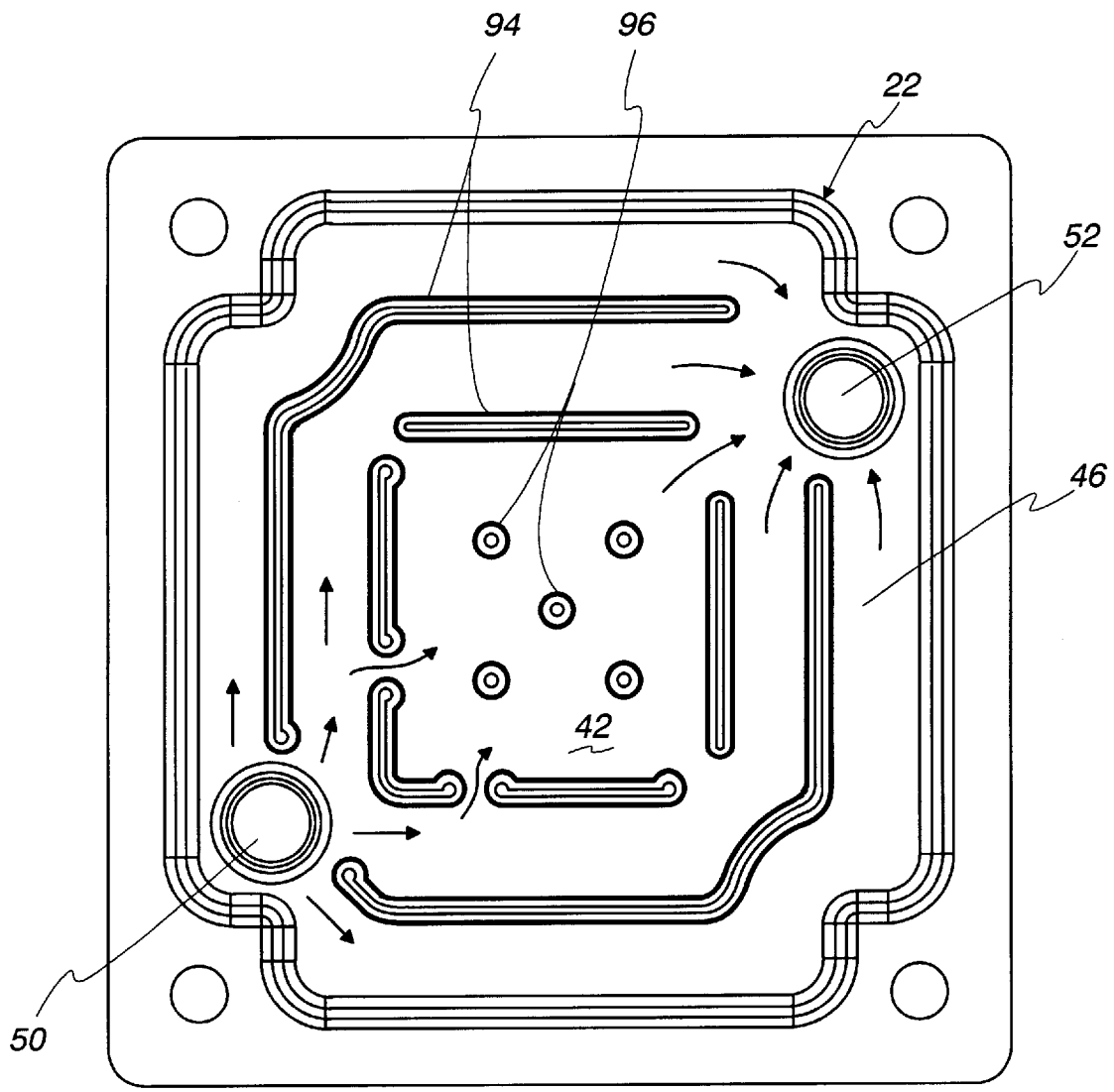
*Fig. 12*

HEAT EXCHANGER FOR ELECTRONIC/ELECTRICAL COMPONENTS

FIELD OF THE INVENTION

This invention relates to a heat exchanger for electronic or electrical components. More specifically, it relates to such a heat exchanger that is ideally suited for use in cooling electronic and/or electrical components in a vehicle utilizing the coolant employed for cooling an internal combustion engine which provides the source of propulsion for the vehicle.

BACKGROUND OF THE INVENTION

Heat exchangers for cooling electronic and/or electrical components in a vehicle are being employed with ever-increasing frequency. It is common knowledge that electronic components which produce heat during operation must be cooled in order to avoid damage to the component and/or printed circuits connecting components on a circuit board. An example of such a heat exchanger is disclosed in EP 1,096,647 A2. The heat exchanger of the above-referenced European patent apparently utilizes an oil as a coolant. The device is intended for use in cooling power electronics as, for example, those utilized in the operation of a combination starter-generator and can be used to control other electronic or electrical components utilized for steering in vehicle control as, for example, electric motors in the vehicle.

It appears that such heat exchangers employed for cooling of electrical or electronic components could utilize a coolant already present on the vehicle utilized for cooling other instrumentalities as, for example, cooling the vehicle's internal combustion engine as such a coolant is circulated in a coolant circuit at the present time.

Cooling of vehicular electronic or electrical components utilizing the circulating engine coolant differs from evaporative cooling where heat rejected by the components to be cooled causes the coolant to undergo a liquid to vapor phase change as heat is rejected into the coolant. A particular difference resides in the fact that in evaporative cooling, an entire circuit board with the electronic components to be cooled is placed in a housing and submerged in an electrically nonconducting heat exchange fluid. The advantage here is that all of the electronic components, which, because of their different nature, reject different quantities of heat during their operation, are subject to cooling so that overheating of all individual components can be avoided. One such evaporative-type cooler is disclosed in unpublished German patent application DE 101 58 387.7.

On the other hand, cooling with an already present coolant, such as engine coolant as mentioned previously, involves a problem quite different from that encountered where the components to be cooled are submerged in a coolant subject to phase change. In particular, in an apparatus such as a vehicle, the engine coolant pump is typically in operation to circulate coolant only when the engine is running. This may be referred to as a "dynamic" cooling operation.

Other components requiring cooling must then be subjected to a design that allows cooling only when coolant is being circulated by a pump or be such that their cooling requirements are minimal, allowing sufficient cooling of them to occur during dynamic cooling operation. However, cases of design and operation occur that require electronic components to be cooled even when the coolant pump is not in operation and coolant is not circulating. This may be referred to as static cooling operation. An example of such a system that can incur cooling problems during static operation is disclosed in German patent publication DE 199 59 023 A1. It cannot respond to the need for cooling of electronic components during static operation because the housing of the device disclosed therein is added as an auxiliary housing to the housing of the coolant circulating pump; and the coolant flows through the auxiliary housing only, if at all, when the coolant pump is in operation, that is, when the system is undergoing dynamic cooling operation.

The present invention is directed to solving one or more of the above problems.

SUMMARY OF THE INVENTION

It is the principal object of the invention to provide a new and improved heat exchanger for the cooling of electronic or electrical components. More particularly, it is an object of the invention to provide such a heat exchanger that may be utilized in a system having a coolant circulating pump and which provides adequate cooling for the components to be cooled whether the cooling system is operating in a dynamic cooling mode or in a static cooling mode.

An exemplary embodiment achieves the foregoing object in a heat exchanger for cooling electronic or electrical components which includes a circuit board on which the components to be cooled are mounted and a coolant channel with a coolant inlet and a coolant outlet in heat exchange contact with the circuit board. The invention contemplates the improvement that includes a container defining a coolant receiving space or depot adjacent to and in heat exchange relation with the flow channel and adapted to contain a coolant to accept heat rejected by the components when the coolant is not flowing in the coolant channel between the inlet and the outlet.

As a consequence of this construction, when the coolant is flowing in the flow channel during dynamic operation, it provides a stream of coolant to which heat from the components may be rejected. At the same time, when coolant is not flowing in the coolant channel (static operation), heat rejected by the components is rejected to coolant in the coolant depot.

In a preferred embodiment, a fluid connection establishing fluid communication between the container and the flow channel is provided.

In a preferred embodiment, there is provided a heat exchanger that includes a first cup-like component having a bottom and a peripheral wall about the bottom, and a second cup-like component having a bottom and a peripheral wall about its bottom. The second component is nested within the first component with their bottoms and peripheral walls spaced from one another to define a coolant flow channel therebetween. A circuit board mounting components to be cooled is mounted on the first component bottom in heat conducting relation thereto on a side thereof opposite the second component bottom. An inlet is provided to the flow channel as well as an outlet from the flow channel. A cover extends about the second component and is sealed to the second component peripheral wall in spaced relation to the second component bottom to define a fluid receiving space. The fluid receiving space is in fluid communication with the flow channel.

Thus, the components to be cooled may be cooled either by fluid circulating in the flow channel by pumping or by fluid in the fluid receiving space, that is, by either dynamic or static operation.

A preferred embodiment includes a heat transfer enhancing structure in the flow channel extending between and metallurgically bonded to the bottoms.

In one embodiment, each of the first and second components includes a peripheral flange extending about each peripheral wall at a location remote from the respective bottom of the component and the flanges are metallurgically bonded and sealed to one another.

Preferably, a fin is located within the fluid receiving space in heat transfer relation with the bottom of the second component and with the cover. Thus, heat rejected to fluid in the fluid receiving space is conducted to the walls and/or cover bounding such space to be dissipated into the atmosphere.

Preferably, the inlet and outlet are respective tubes which extend, in spaced relation through the fluid receiving space.

In one embodiment, the second component bottom includes spaced inlet and outlet ports to the flow channel and the tubes extend to and terminate just short of a corresponding one of the ports. In this structure, a small space between the ends of the tubes and the ports serves to establish fluid communication between the flow channel and the fluid receiving space.

In an alternative embodiment, the second component bottom includes spaced inlet and outlet ports to the flow channel and the tubes extend and are sealed to a corresponding one of the ports. Each of the tubes includes at least one aperture in a wall thereof opening within the fluid receiving space. In this embodiment, the apertures establish fluid communication between the flow channel and the fluid receiving space.

A highly preferred embodiment contemplates that there be a fin in the flow channel and even more preferably, the invention contemplates that the fin be metallurgically bonded to both of the component bottoms.

In a highly preferred embodiment, the fin is a lanced and offset fin.

In an alternative embodiment, a fluid guide is located in the flow channel for directing flow therein in a predetermined pattern between the inlet and the outlet.

Preferably, the flow guide includes at least one bead formed in at least one of the component bottoms and which extends toward and contacts the other of the component bottoms.

A highly preferred embodiment contemplates that the bead be formed in the second component bottom.

The invention also contemplates that the components and the cover be formed of braze clad aluminum and are brazed together.

Other objects and advantages will become apparent from the following specification taken in connection with the accompanying drawings.

DESCRIPTION OF THE DRAWINGS

FIG. 5 is an exploded, sectional view of the first embodiment of the invention and taken approximately along the line 5—5 of FIG. 6;

FIG. 6 is a plan view of the first embodiment of the invention and which is substantially identical to FIG. 2;

FIG. 7 is a side elevation of the embodiment of FIG. 1 but with part of the heat exchanger removed for clarity;

FIG. 8 is a sectional view taken approximately along the line 8—8 in FIG. 7;

FIG. 11 is a view similar to FIG. 9 but of still a further modified embodiment of the invention;

FIG. 12 is a plan view of the embodiment illustrated in FIG. 11;

DESCRIPTION OF THE PREFERRED EMBODIMENTS

Exemplary embodiments of the invention are disclosed herein in the context of cooling circuit boards mounting electronic or electrical components. However, it is to be understood that the invention can be utilized in cooling electronic or electrical components that are not mounted on circuit boards where both dynamic and static cooling operations are required. Similarly, the invention is described in the context of a vehicle having an internal combustion engine having a coolant system wherein coolant is circulated by a pump. However, again, the invention is not limited to vehicular systems but may be used with efficacy in any type of system wherein coolant is circulated by a pump that is operated intermittently. Thus, no limitation is intended to circuit boards and/or vehicular systems except insofar as expressly stated in the appended claims.

Figure 1:
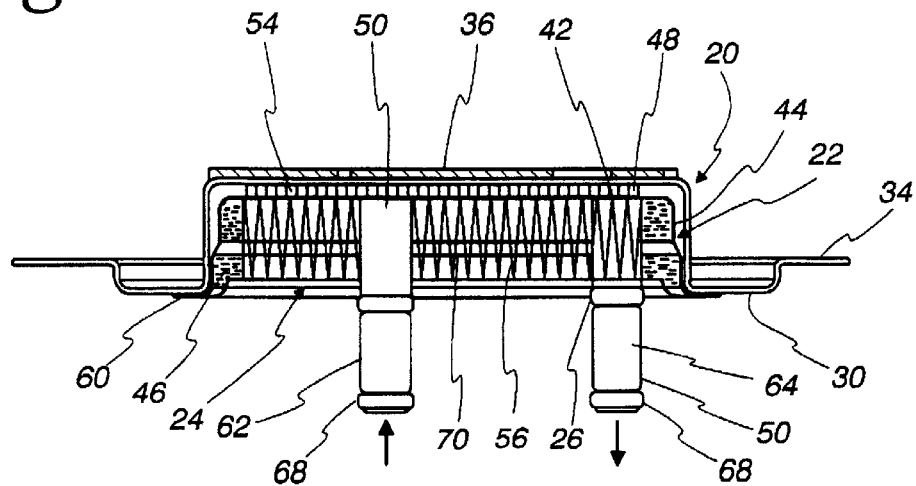
FIG. 1 is a sectional view of a heat exchanger made according to the invention taken approximately along the line 1—1 in FIG. 2.

With the foregoing in mind, reference will now be made to FIGS. 1, 2, 5 and 6. As seen in FIGS. 1 and 5, the heat exchanger is formed of a first, cup-like component, generally designated 20, a second, cup-like component generally designated 22 and a cover, generally designated 24. The first cup-like component includes a bottom 26 which is generally flat and which is surrounded by a peripheral wall 28. The peripheral wall has, at its edge opposite the bottom 26, an outwardly extending peripheral flange 30 which is stamped as at 32 to join with a further, outwardly extending, flange 34. Preferably, the first component 20 is formed as by drawing or stamping out of aluminum which in turn is clad with a suitable braze alloy (not shown).

Figure 2:
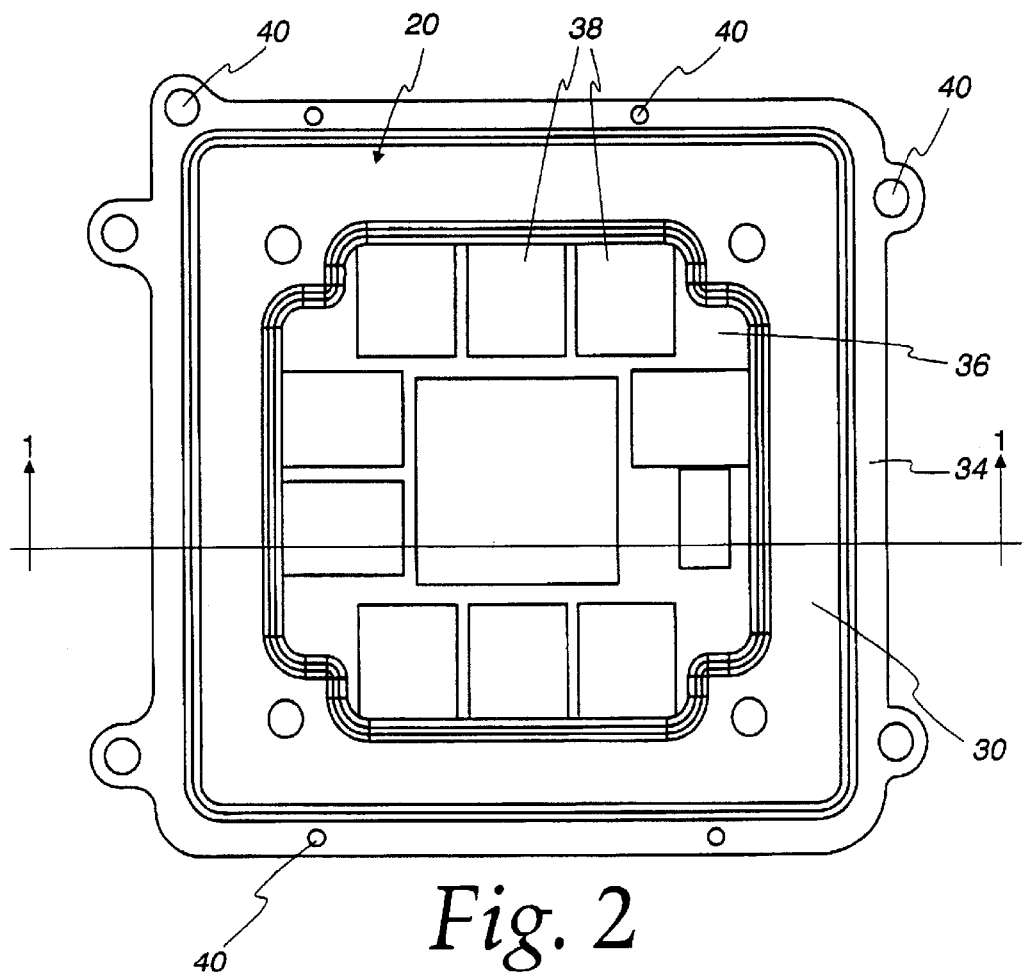
FIG. 2 is a plan view of the heat exchanger.

A circuit board 36 is adhered to the bottom 26 of the first component 20 by any suitable thermally conductive adhesive and, as seen in FIGS. 2 and 6, mounts a plurality of electronic or electrical components 38.

As seen in FIGS. 2 and 6, the flange 34 is provided with a series of apertures 40 through which fasteners may pass to secure the heat exchanger to a mounting panel or the like. The flange 30, being displaced from the flange 34, serves as a stiffening bead for the flange 34.

The second component 22 is likewise formed of braze clad aluminum by stamping or a deep drawing process and includes a flat bottom 42 surrounded by a peripheral wall 44 which in turn terminates at an edge opposite the flat bottom in an outwardly directed, peripheral flange 46. As can best be seen in FIG. 1, the peripheral wall 44 of the second component 22 has a lesser depth than the peripheral wall 28 of the first component 20 and is formed to be located inwardly of the peripheral wall 28 of the first component 20 so as to form a flow channel 48 (FIG. 1) between the two.

In addition, the bottom wall 42 of the second component 22 includes a pair of spaced ports 50,52 which may respectively serve as inlet and outlet ports to the flow channel 48 and which will be described in greater detail hereinafter.

The arrangement is such that the second component 22 may nest within the first component 20 as illustrated in FIG. 1 with their respective flanges 46 and 30 in abutment with one another and brazed and sealed together so that the only access to the coolant flow path 48 is via the ports 50,52.

A fin 54, preferably formed of aluminum, is disposed between the flat bottoms 26 and 42 of the first and second components 20,22 respectively. The fin 54 is brazed to both of the bottoms 26 and 42 by the braze alloy on the bottoms 26 and 42. However, if desired, the fin 54 could also be provided with aluminum braze cladding.

Referring to FIGS. 1 and 5, a serpentine fin 56 is located within the second component 22 in abutment with the bottom 42 thereof as well as with the cover 24 as seen in FIG. 1. Through holes (not shown) are formed in the fin 56 in the locations of the ports 50,52 so as to allow access to them in a manner to be seen hereinafter. Again, the fin 56 will be formed of aluminum and will be metallurgically bonded to both the cover 24 and the bottom 42 of the second component 22 by braze clad material thereon. And again, if desired, braze cladding could be placed on the fin 56 as well.

The cover 24, as alluded to previously, has a coating of braze clad material and typically will be formed of a base metal, namely aluminum. The same has a raised platform 58 in its central region surrounded by a peripheral flange 60 that abuts against the flange 46 on the second component 22 to be sealingly, metallurgically bonded thereto.

In alignment with the ports 50 and 52 are respective inlet and outlet tubes 62,64 which are located on the cover 24 by conventionally formed peripheral beads 66. The tubes 62,64 may also have beads 68 near the ends thereof remote from the ports 50,52 to aid in securing fluid conduits thereto in a known fashion.

Figure 15:
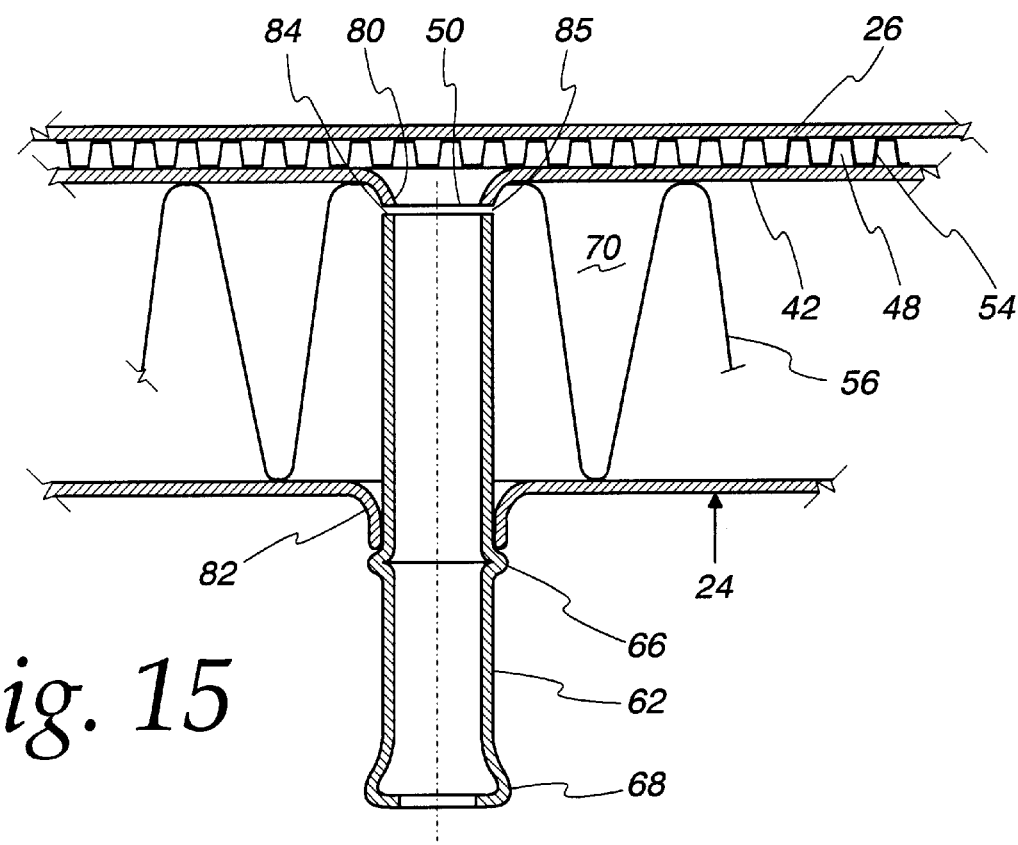
FIG. 15 is a fragmentary, sectional view of a porting system used in one embodiment of the invention.
Figure 16:
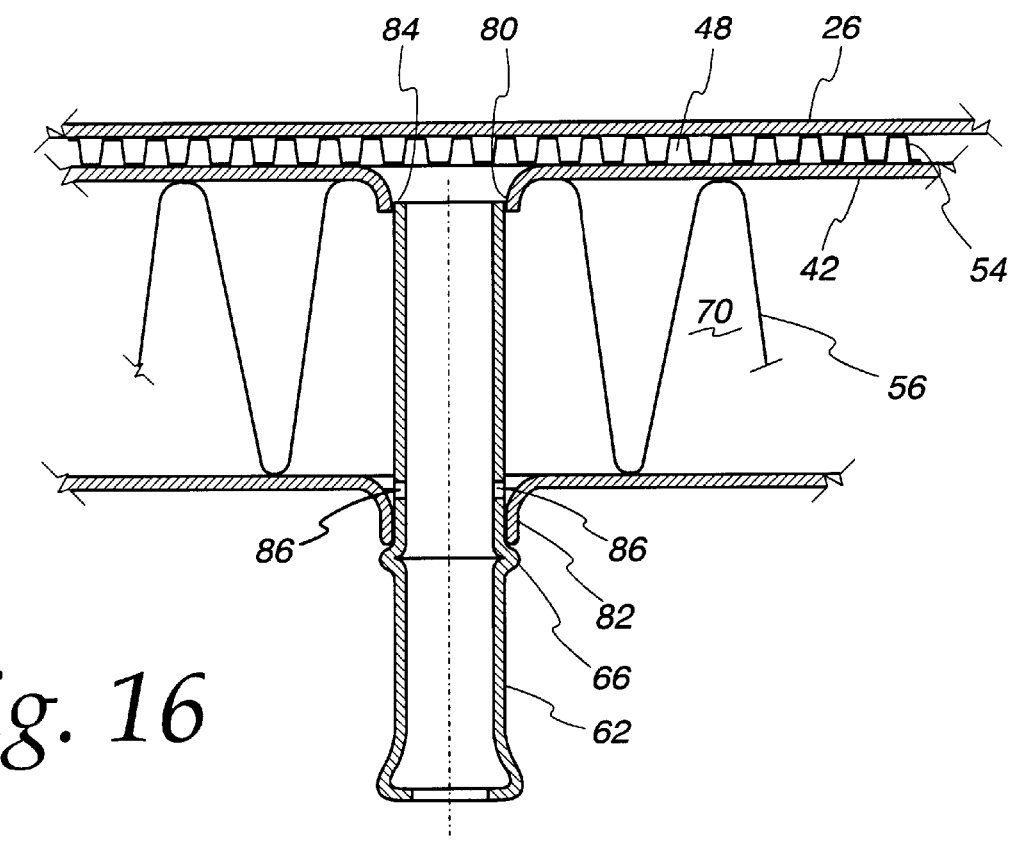
FIG. 16 is a view similar to FIG. 15 but of a modified embodiment of the porting arrangement.

The placement of the cover 24 on the second component 22 provides a fluid receiving space 70 bounded by the cover 24 on one side, the bottom 42 of the second component 22 on the other and the peripheral wall 44 joining the two. To place the fluid receiving space 70 in fluid communication with the flow channel 48, a structure such as shown in FIG. 15 or 16 may be utilized. As the structure may be the same for both of the ports 50,52, only that associated with the port 50 will be described. The port 50 has a collar 80 which is directed into the fluid receiving space 70 from the flow channel 48 while the cover 24 has a similar collar 82 which receives the tube 62 such that the bead 66 abuts against the end of the collar 82. This locates an end 84 of the tube 62 in spaced relation to the end of the collar 80 as shown by a gap 85. In the usual case, the gap 85 will be but a few millimeters in length and is annular, that is, extends entirely about the end 84 of the tube 62.

Alternatively, and as shown in FIG. 16, the collar 80 on the bottom 42 may extend somewhat more deeply into the fluid receiving space 70 such that the end 84 of the tube 62 enters the collar 80 and may be brazed thereto to be sealed thereagainst. In this embodiment, a series of apertures 86 are located in the wall of the tube 62 just above the bead 66 to be in fluid communication with the fluid receiving space 70 at that location. In either case, because the tubes 62,64 provide an inlet and an outlet respectively to the flow channel 48, the annular gap 85 or the apertures 86 establish fluid communication between the fluid receiving space 70 and the flow channel 48.

Operation during a dynamic cooling operation provides cooling by coolant entering the inlet tube 62 and flowing through the flow channel 48 to exit the outlet tube 64. This coolant will circulate under the influence of a pump and in the case of a vehicle, the coolant may be the same coolant as that circulated through an internal combustion engine employed for propelling the vehicle. The vehicle coolant pump may be utilized for this purpose simply by connecting the inlet and outlet tube 62,64 into the circulating coolant system for the vehicle.

In a static mode of operation, the pump will not be operating, as when the engine has been turned off. In this situation, coolant will not be flowing in the flow channel 48. However, heat rejected by the electrical components 38 on the circuit board 36 will be rejected to the bottom 26 of the first component 20 and conducted to the bottom 42 of the second component 22 by the fin 54 as well as by any coolant remaining the flow channel 48. The fluid within the fluid receiving space 70 will have the heat traveling to the bottom 42 of the second component 22 rejected to it thereby providing cooling for the electrical components 38. To the extent that the heat is sufficient to cause coolant in the fluid receiving space 70 to achieve its boiling temperature, the same will simply begin to evaporate therein, all the while absorbing the latent heat evaporization to provide cooing at a temperature substantially equal to the boiling point of the coolant. Gas formed in the fluid receiving space from the coolant, or any gas from a noncoolant source and dissolved or entrained in the coolant may empty into the coolant circulating system via either or both of the inlet and outlet tubes 62,64.

To the extent that a small layer of gas or coolant vapor may form adjacent the bottom 42 of the second component 22 during a static cooling operation, the fact that the fin 56 is metallurgically bonded to the bottom 42 and extends downwardly to be bonded to the cover 24 means that the fin 56 will be immersed in a pool of coolant within the space 70 and thermally conduct the rejected heat thereto.

It is also to be observe that heat may be rejected to the ambient through the cover 24 to provide a further measure of cooling.

Figure 3:
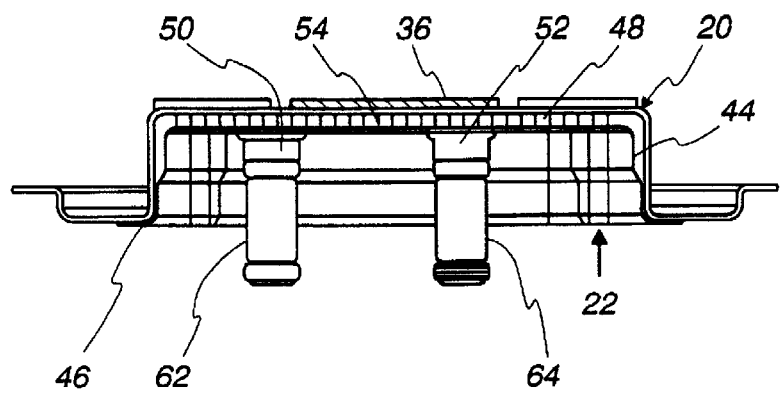
FIG. 3 is a view similar to FIG. 1 but of a modified embodiment of the invention and taken along the line 3—3 of FIG. 4.
Figure 4:
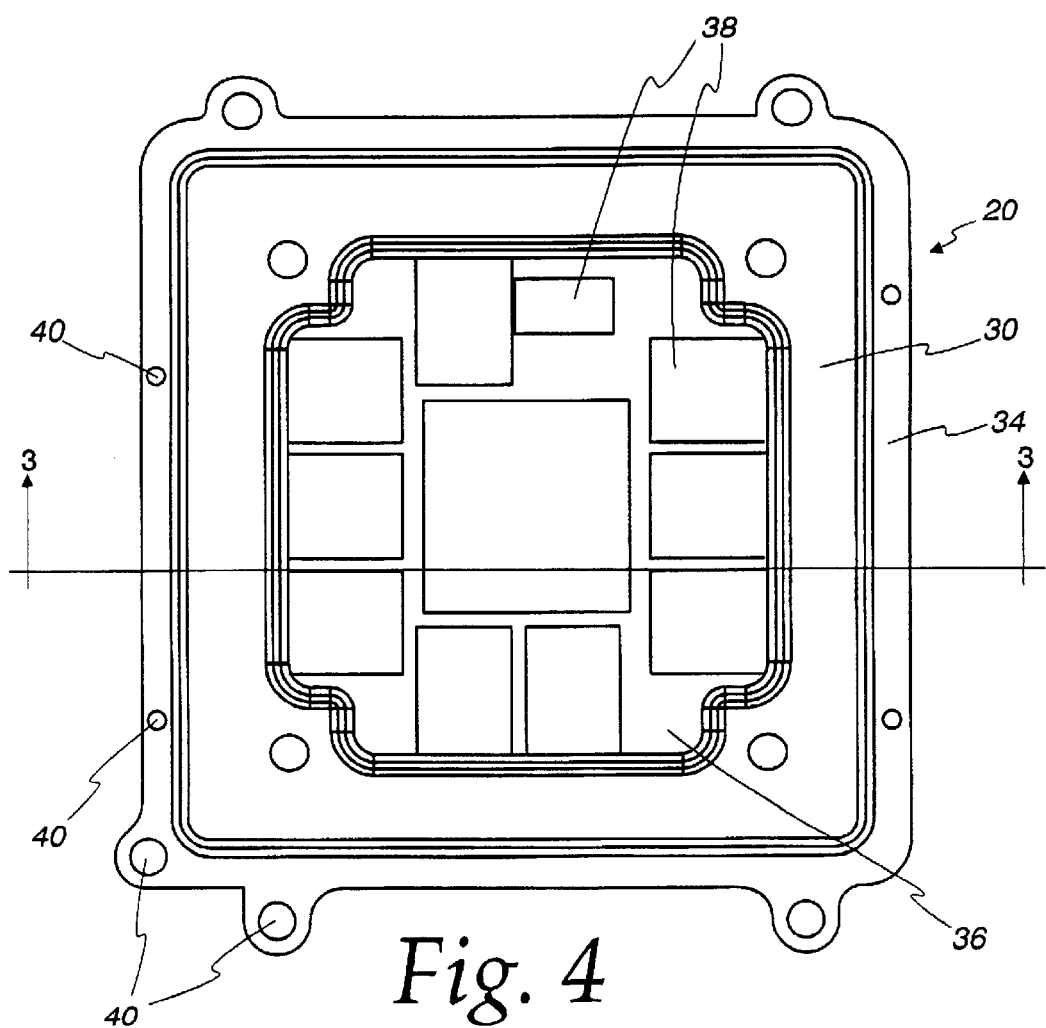
FIG. 4 is a plan view of the modified embodiment of FIG. 3.
Figure 9:
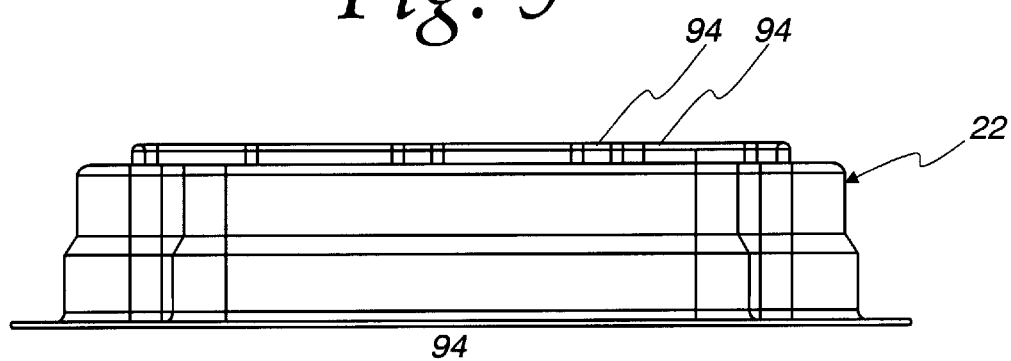
FIG. 9 is a view similar to FIG. 7 but of a modified embodiment of the invention.

FIGS. 3 and 4 show a modified embodiment of the invention that may be employed in situations where static cooling operation is not of great concern. Because the structure is quite similar, and in many respects, identical to the embodiment illustrated in FIG. 1, in the interest of brevity, like components will be given identical reference numerals and will not be redescribed.

In the embodiment of FIG. 3, the cover 24 is omitted entirely and the inlet and outlet tubes 62,64 are fitted directly to the ports 50,52 generally in the manner illustrated in FIG. 16 and described previously. In this case, however, the apertures 86 in the wall of the tubes 62,64 are omitted. The resulting structure includes the flow channel 48 but lacks the flow receiving space 70. Because the components are identical, except for the absence of the openings 86 in the tubes 62,64, an advantageous structure results. In particular, because the components used in the embodiment of FIG. 1 may be employed without modification (except for the removal of the openings 86), an inexpensive heat exchanger is provided. That is to say, because the components of the embodiment of FIG. 1 may be utilized in a different type of heat exchanger without modification, two different types of heat exchangers may be easily formed using the components of the embodiment of FIG. 1 as illustrated in FIGS. 3 and 4.

The fin 54 is illustrated in greater detail in FIGS. 7 and 8. the fin 54 is a conventional lanced and offset fin made by a plurality of staggered cuts 90,92 with the portion of the fin between the cuts 90,92, displaced either up or down to form a roughly sinusoidal configuration as is apparent from a viewing of the fins 54 in FIGS. 15 and 16. The displaced areas alternately are bonded to the bottoms 26,42, of the first and second components 20,22 and the cuts 90 are staggered with the cuts 92 as is visible in FIG. 8.

The use of lanced and offset fin 54 allows the achieving of desired flow characteristics in the flow channel 48. For flow going from left to right as viewed in FIG. 8, those skilled in the art will recognize that pressure loss is minimized as a result of lesser turbulence in the coolant induced by the fin 54 and heat exchange is not particularly high. Such a flow pattern may be desirable where low pressure drop is required and a reduction in heat transfer tolerated.

On the other hand, if the flow were going from top to bottom as viewed in FIG. 8, a high pressure loss would occur as a result of increased turbulence and an excellent rate of heat exchange would be obtained. Thus, such an orientation may be utilized when high rates of heat exchange are necessary and high pressure drops can be tolerated.

In the embodiment illustrated, with the ports 50 and 52 being arranged at diagonally opposite corners of the fin 54, the best of both worlds may be obtained. The pressure drop will relatively low and heat exchange relatively high. In the illustrated embodiment, a line connecting the ports 50 and 52 should be at approximately 45° to the horizontal or the vertical which is to say, at 45° to the corrugations of the fin 54.

Figure 10:
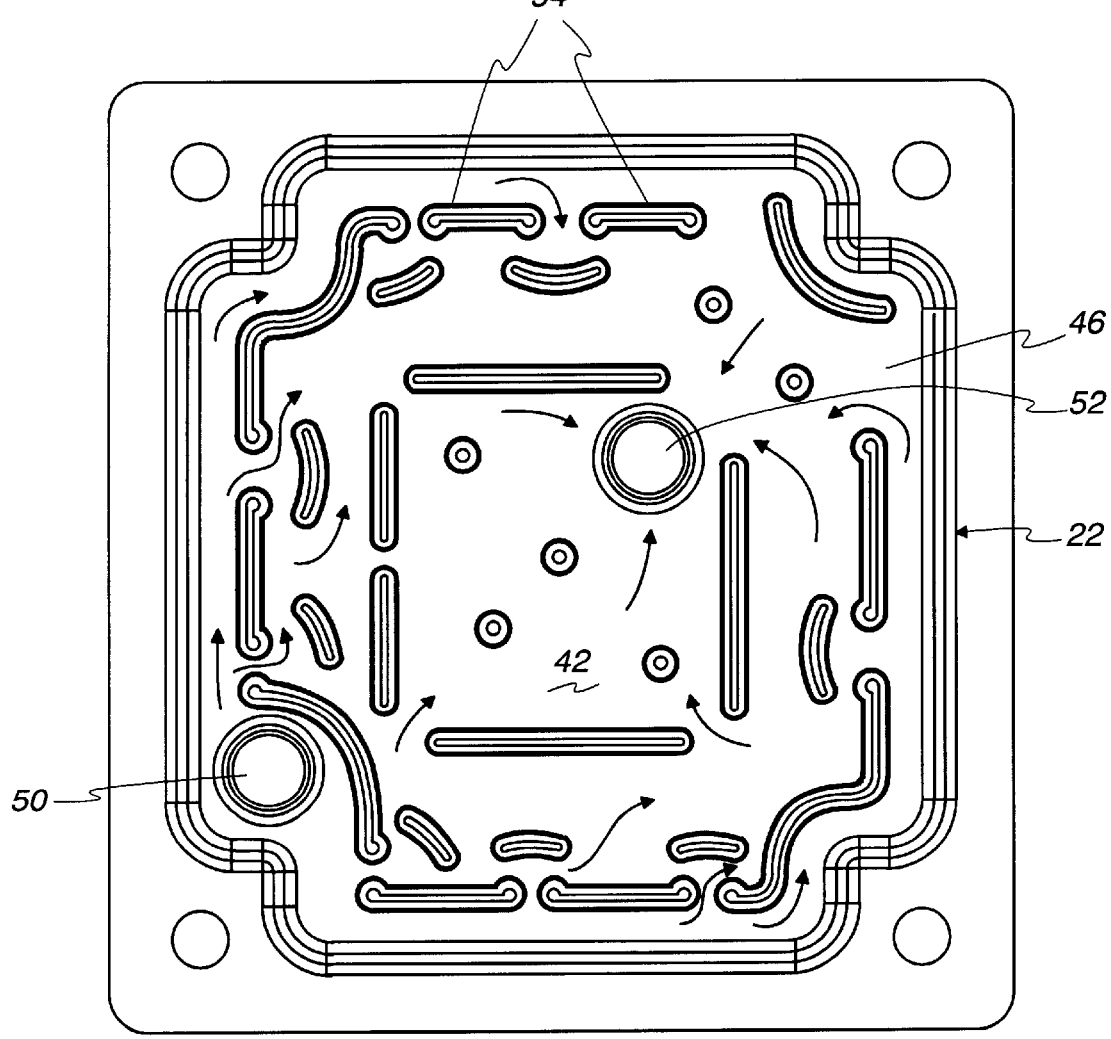
FIG. 10 is a plan view of the embodiment shown in FIG. 9.
Figures 13, 14:
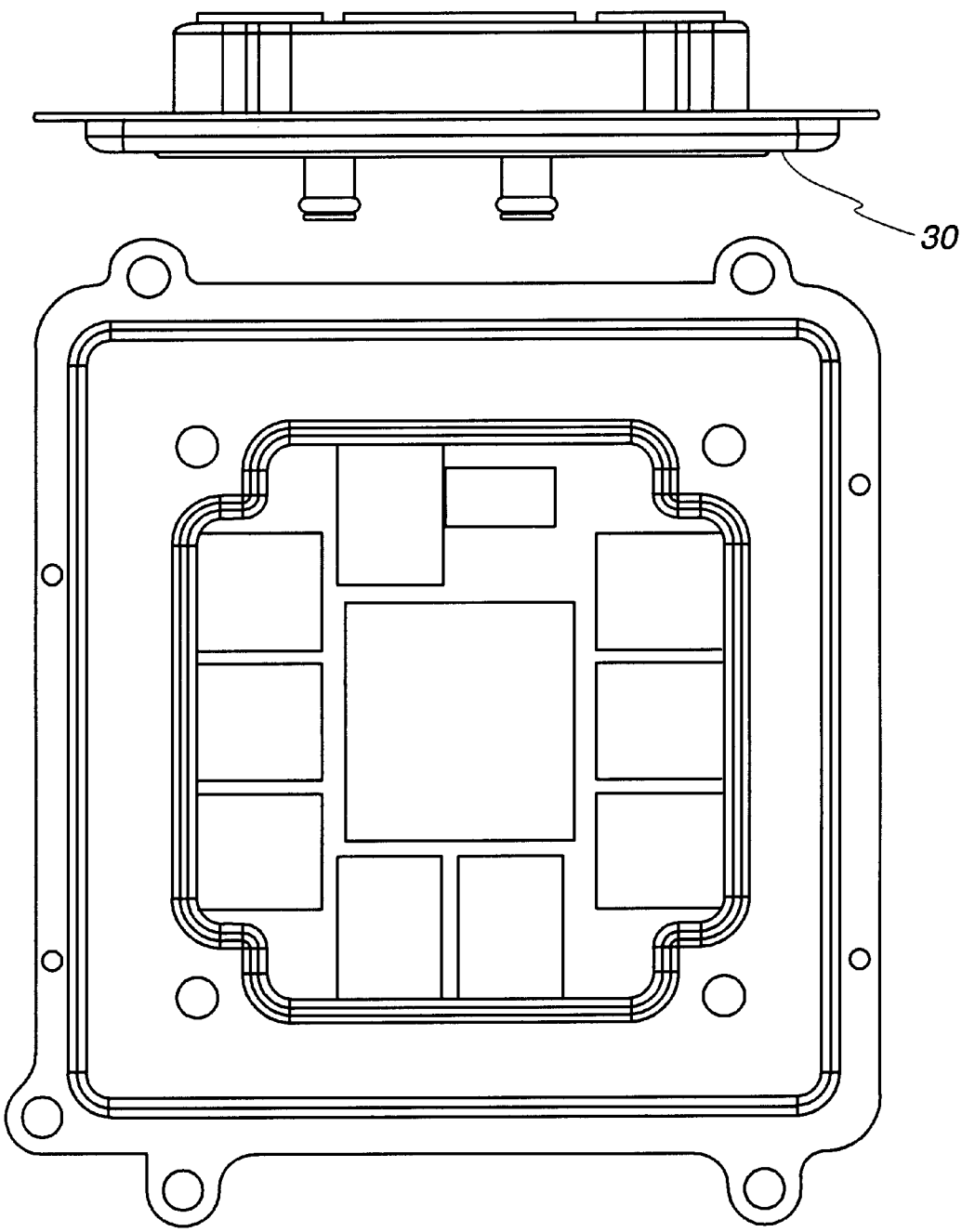
FIG. 13 is a side elevation of the embodiment of FIG. 1.
FIG. 14 is a plan view of FIG. 13.

FIGS. 9–12 illustrate a modified embodiment of the invention wherein the fin 54 is dispensed with in favor of beads 94 that extend between the bottoms 26,42 of the first and second components 20 and 22 respectively. While the beads 94 could be formed in either or both of the bottoms 26,42, it is preferred that they be formed in the bottom 46 as by stamping. During assembly of the heat exchanger, which includes brazing the components together, the beads 94 will braze into good heat transfer contact with the bottom 26 of the first component 20. The beads 94 are configured as, for example, as shown in FIG. 10 or, as shown in FIG. 12 to provide desired flow characteristics from the port 50 to the port 52 to achieve a desired flow pattern. In some instances, the components 38 on the circuit board 36 will have different levels of heat rejection and through the use of flow guides in the form of the beads 94, greater flow and/or turbulence can be achieved in the area of those components 38 requiring a greater amount of cooling to assure that all components are cooled uniformly.

If desired, circular bumps 96 may also be formed in the bottom 42 to be metallurgically bonded to the bottom 26. This provides additional strength, specifically, resistance against a high pressure tending to expand the flow channel 48, as well an increased degree of heat transfer.

The height of the beads 94, shown at h in FIG. 11, should be equal to the height of the flow channel 48 to achieve the desired contact, bonding and heat transfer characteristics. The beads 94 may define narrow flow channels, wide flow channels, long flow channels, short flow channels, straight flow channels, or curved or bent flow channels as desired so as to guide the coolant to required positions of the components 38 to cool them sufficiently.

It is preferred that the beads 94 be formed in the bottom 46 of the second component 22 rather than in the bottom 26 of the first component 20. In this way, the entire bottom surface of the bottom 26 will be in heat transfer contact with the circuit board 36 to assure maximum heat transfer.

Though the drawings herein depict the first and second components 20,22 in rectangular form, they are cup-shaped in the sense that they include a bottom having a peripheral wall. The particular shape of the peripheral wall can be modified to suit any particular usage and no limitation as to a particular peripheral shape is intended.

It will be appreciated that all of the components may be assembled in the order depicted in FIG. 5 with the two components 20,22 and the cover 24 held together, essentially clamping the fins 54,56 in place and then brazed together to form a unitary, sealed assembly. The heat exchanger is simple to construct and the embodiments of all figures save for that of FIGS. 3 and 4 provide for both a dynamic and a static cooling operation and thereby offer a greater measure of protection for electrical or electronic components requiring cooling as a result of their operation.

What is claimed is:

1. A heat exchanger for cooling electronic or electrical components, comprising:
    a first cup-like component having a bottom and a peripheral wall about the bottom;
    a second cup-like component having a bottom and a peripheral wall about the bottom, said second component being nested within said first component with their bottoms and peripheral walls spaced from one another to define a flow channel therebetween;
    a circuit board mounting components to be cooled mounted on said first component bottom in heat conducting relation thereto and on a side thereof opposite said second component bottom;
    an inlet to said flow channel;
    an outlet from said flow channel; and
    a cover extending about said second component and sealed to said second component peripheral wall in spaced relation to said second component bottom to define a fluid receiving space, said fluid receiving space being in fluid communication with said flow channel;
    whereby said components to be cooled may be cooled either by fluid circulating in said flow channel by pumping or by fluid in said fluid receiving space.

2. The heat exchanger of claim 1 further including a heat transfer enhancing structure in said flow channel extending between and metallurgically bonded to said bottoms.

3. The heat exchanger of claim 1 wherein each of said first and second components includes a peripheral flange extending about each peripheral wall at a location remote from their respective bottom, said flanges being metallurgically bonded and sealed to one another.

4. The heat exchanger of claim 1 wherein a fin is located within said fluid receiving space in heat transfer relation with said bottom of said second component and with said cover.

5. The heat exchanger of claim 1 wherein said inlet and outlet are respective tubes which extend, in spaced relation, through said fluid receiving space.

6. The heat exchanger of claim 5 wherein said second component bottom includes spaced inlet and outlet ports to said flow channel and said tubes extend to and terminate just short of a corresponding one of said ports.

7. The heat exchanger of claim 5 wherein said second component bottom includes spaced inlet and outlet ports to said flow channel and said tubes extend to a corresponding one of said ports, each said tube including at least one aperture in a wall thereof and opening within said fluid receiving space.

8. The heat exchanger of claim 1 further including a fin in said flow channel.

9. The heat exchanger of claim 8 wherein said fin is metallurgically bonded to both said first and second component bottoms.

10. The heat exchanger of claim 9 wherein said fin is a lanced and offset fin.

11. The heat exchanger of claim 1 further including a flow guide in said flow channel for directing flow therein in a predetermined pattern between said inlet and said outlet.

12. The heat exchanger of claim 11 wherein said flow guide includes at least one bead formed in at least one of said component bottom and extending toward and contacting the other of said component bottoms.

13. The heat exchanger of claim 12 wherein said bead(s) is formed in said second component bottom.

14. The heat exchanger of claim 1 wherein said first and second components and said cover are formed of braze clad aluminum and are brazed together.

15. In a heat exchanger for cooling electronic or electrical components including a circuit board on which the components are mounted and a coolant channel with a coolant inlet and a coolant outlet in heat exchange contact with the circuit board, the improvement including a container defining a coolant depot adjacent to and in heat exchange relation with said flow channel and adapted to contain a coolant to accept heat rejected by said components when coolant is not flowing in said coolant channel between said inlet and said outlet.

16. The heat exchanger of claim 15 further including a fluid connection establishing fluid communication between said container and said flow channel.

* * * * *